US012673389B2

(12) United States Patent

Iga

(10) Patent No.: US 12,673,389 B2

(45) Date of Patent: Jul. 7, 2026

(54) METHOD OF MANUFACTURING MONOCRYSTALLINE SILICON SUBSTRATE

(71) Applicant: DISCO CORPORATION, Tokyo (JP)

(72) Inventor: Hayato Iga, Tokyo (JP)

(73) Assignee: DISCO CORPORATION, Tokyo (JP)

(*) Notice: Subject to any disclaimer, the term of this patent is extended or adjusted under 35 U.S.C. 154(b) by 589 days.

(21) Appl. No.: 18/323,574

(22) Filed: May 25, 2023

(65) Prior Publication Data

US 2023/0390870 A1 Dec. 7, 2023

(30) Foreign Application Priority Data

Jun. 1, 2022 (JP) ................................. 2022-089695

(51) Int. Cl.
| | |
|---|---|
| *B23K 26/53* | (2014.01) |
| *B23K 26/00* | (2014.01) |
| *B23K 26/08* | (2014.01) |
| *B23K 26/402* | (2014.01) |
| *B23K 101/40* | (2006.01) |
| *H10P 54/00* | (2026.01) |
| *B23K 103/00* | (2006.01) |

(52) U.S. Cl.
CPC .......... *B23K 26/53* (2015.10); *B23K 26/0006* (2013.01); *B23K 26/0876* (2013.01); *B23K 26/402* (2013.01); *H10P 54/00* (2026.01); *B23K 2101/40* (2018.08); *B23K 2103/56* (2018.08)

(58) Field of Classification Search
CPC ............... B23K 26/53; B23K 26/0006; B23K 26/0876; B23K 26/402; B23K 2101/40; B23K 2103/56; H01L 21/78
See application file for complete search history.

(56) References Cited

U.S. PATENT DOCUMENTS

| | | | |
|---|---|---|---|
| 2016/0243833 A1 | 8/2016 | Shibata | |
| 2020/0316724 A1* | 10/2020 | Donofrio | B23K 26/0006 |
| 2021/0316476 A1* | 10/2021 | Nomaru | B23K 26/0622 |

FOREIGN PATENT DOCUMENTS

| | | |
|---|---|---|
| JP | 09262826 A | 10/1997 |
| JP | 2016157872 A | 9/2016 |
| JP | 2022025566 A | 2/2022 |
| JP | 2022035132 A | 3/2022 |

OTHER PUBLICATIONS

Office Action issued by the Japanese Patent Office in corresponding JP Patent Application No. 2022-089695, dated Jan. 13, 2026.

* cited by examiner

*Primary Examiner* — Andrew J Marien
(74) *Attorney, Agent, or Firm* — Greer Burns & Crain Ltd.

(57) ABSTRACT

The application of laser beams to at least two of a plurality of regions extending along a predetermined direction and the changing of at least two regions to which the laser beams are to be applied are alternately repeated to form peel-off layers in the ingot that include a plurality of modified portions positioned at a predetermined depth from the surface of the workpiece and cracks developed from the respective modified portions. The laser beams for forming the peel-off layers in the workpiece are thus simultaneously applied to the at least two of the regions. Therefore, it is possible to increase the throughput compared with a process in which the laser beams are applied successively to the regions.

3 Claims, 13 Drawing Sheets

METHOD OF MANUFACTURING MONOCRYSTALLINE SILICON SUBSTRATE

BACKGROUND OF THE INVENTION

Field of the Invention

The present invention relates to a method of manufacturing a monocrystalline silicon substrate from a workpiece of monocrystalline silicon that has been fabricated such that a particular crystal plane included in crystal planes {100} is exposed on face and reverse sides thereof.

Description of the Related Art

Semiconductor device chips are generally fabricated from a disk-shaped monocrystalline silicon substrate, hereinafter also referred to as "substrate." The substrate is sliced from a cylindrical ingot of monocrystalline silicon, hereinafter also referred to as "ingot," using a wire saw (see, for example, Japanese Patent Laid-open No. H09-262826).

Saw kerfs that must be taken into account when slicing substrates from ingots with a wire saw are comparatively large as they are approximately 300 μm wide each. In addition, the sliced substrates leave minute surface irregularities on their surfaces, and are likely to be curved or warped as a whole. Therefore, the surfaces of the sliced substrates need to be lapped, etched, and/or polished to a flat smooth finish.

After an ingot has been sliced into substrates and the substrates have been finished, the amount of monocrystalline silicon that is eventually left in the substrates is approximately ⅔ of the overall amount of monocrystalline silicon of the ingot. In other words, approximately ⅓ of the overall amount of monocrystalline silicon of the ingot turns into sawdust to be disposed of in the slicing and planarizing steps. For this reason, the productivity of the process of manufacturing substrates from ingots using a wire saw is low.

In view of the above problems, there has been proposed a method of manufacturing a substrate from an ingot of monocrystalline silicon by forming peel-off layers, which include modified portions and cracks developed from the modified portions, in the ingot using a laser beam that has a wavelength transmittable through monocrystalline silicon, and separating a substrate from the ingot along the peel-off layers acting as separation initiating points (see, for example, Japanese Patent Laid-open No. 2022-25566). The productivity of the proposed method is higher than that of the process of manufacturing a substrate from an ingot using a wire saw.

SUMMARY OF THE INVENTION

According to the proposed method, the application of a laser beam to either one of a plurality of regions each extending in the ingot along a predetermined direction and the changing from one to another of the regions to which the laser beam is to be applied are alternately repeated to form peel-off layers in the ingot that include a plurality of modified portions positioned at a predetermined depth from the surface of the ingot and cracks developed from the respective modified portions.

However, the method involves an increased period of time required to manufacture the substrate from the ingot, i.e., results in a reduced throughput. It is therefore an object of the present invention to provide a method of manufacturing a monocrystalline silicon substrate from a workpiece with an increased throughput.

In accordance with an aspect of the present invention, there is provided a method of manufacturing a monocrystalline silicon substrate from a workpiece of monocrystalline silicon that has been fabricated such that a particular crystal plane included in crystal planes {100} is exposed on face and reverse sides thereof, including a peel-off layer forming step of forming peel-off layers including a plurality of modified portions and cracks developed respectively from the modified portions, respectively in a plurality of regions included in the workpiece, and, after the peel-off layer forming step, a separating step of separating the substrate from the workpiece along the peel-off layers acting as separation initiating points, in which each of the regions extends along a first direction, the first direction represents a direction oriented parallel to the particular crystal plane and forming an angle of 5° or less with a particular crystal orientation included in crystal orientations <100>, adjacent ones of the regions are spaced from each other by a predetermined center-to-center distance in a second direction, the second direction represents a direction oriented parallel to the particular crystal plane and perpendicularly to the first direction, the predetermined center-to-center distance ranges from 100 μm to 1 mm, and the peel-off layer forming step is performed by alternately repeating a laser beam applying step of relatively moving, along the first direction, the workpiece and a plurality of focused spots formed from respective laser beams having a wavelength transmittable through monocrystalline silicon and arrayed along the second direction, while the focused spots are being positioned in at least two of the regions at a predetermined depth in the workpiece from the face side thereof, and an indexing feed step of changing positions in which the focused spots are formed from respective positions in the at least two of the regions to positions in at least other two of the regions that are different from the at least two of the regions.

Preferably, a distance between adjacent ones of pairs of the focused spots formed in each of the at least two of the regions is smaller than the predetermined center-to-center distance.

According to the present invention, the application of laser beams to at least two of a plurality of regions extending along a predetermined direction and the changing of at least two regions to which the laser beams are to be applied are alternately repeated to form peel-off layers in the ingot that include a plurality of modified portions positioned at a predetermined depth from the surface of the workpiece and cracks developed from the respective modified portions.

According to the present invention, the laser beams for forming the peel-off layers in the workpiece are thus simultaneously applied to the at least two of the regions. According to the present invention, therefore, it is possible to increase the throughput compared with a process in which the laser beams are applied successively to the regions.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
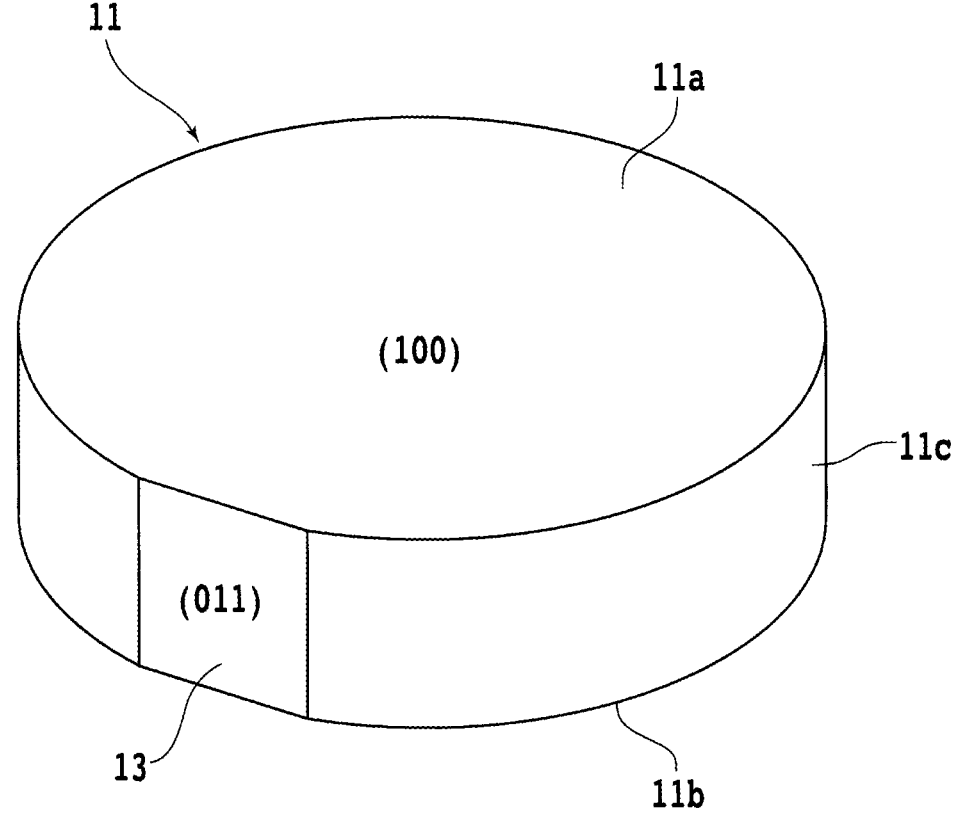
FIG. 1 is a schematic perspective view illustrating an ingot from which a substrate is to be manufactured.

A preferred embodiment of the present invention will be described below with reference to the accompanying drawings. FIG. 1 schematically illustrates, in perspective, an ingot from which a substrate is to be manufactured, and FIG. 2 schematically illustrates, in plan, the ingot illustrated in FIG. 1.

FIG. 1 also illustrates crystal planes of monocrystalline silicon that are exposed on flat surfaces of the ingot. FIG. 2 also illustrates a crystal orientation of monocrystalline silicon of the ingot.

Figure 2:
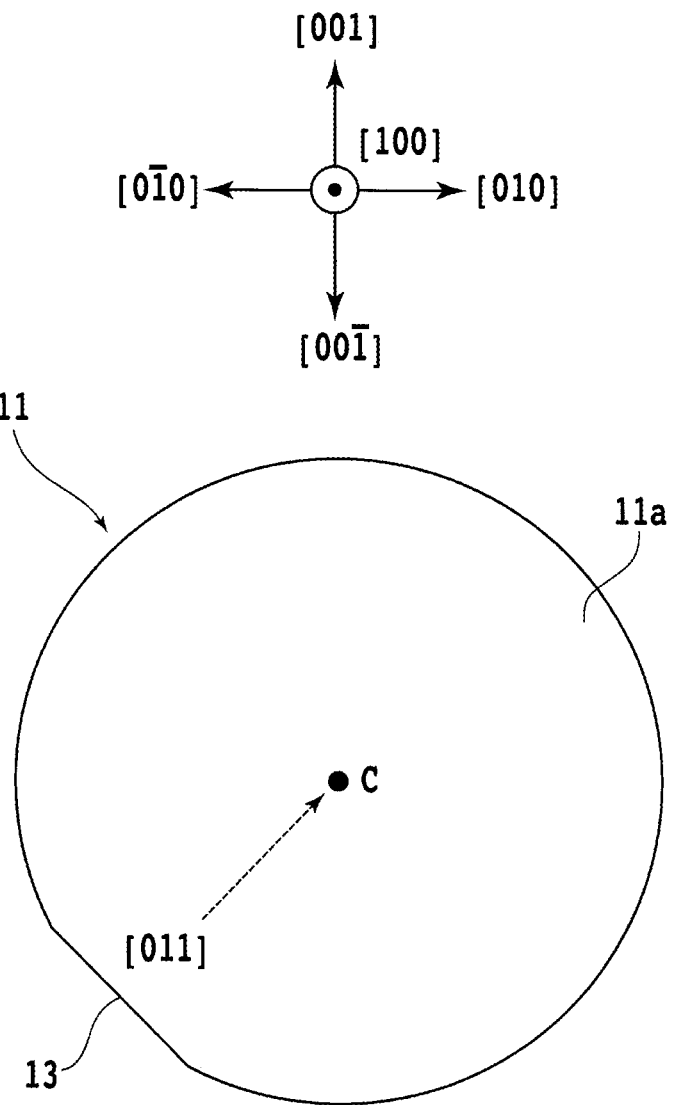
FIG. 2 is a schematic plan view of the ingot illustrated in FIG. 1.

The ingot, denoted by 11, illustrated in FIGS. 1 and 2, is shaped as a cylinder of monocrystalline silicon where a particular crystal plane, given herein as a crystal plane (100) for the sake of convenience, included in crystal planes {100} is exposed on each of a face side 11a and a reverse side 11b of the ingot 11. Stated otherwise, the ingot 11 is shaped as a cylinder of monocrystalline silicon where a line perpendicular to each of the face side 11a and the reverse side 11b, i.e., a crystal axis of the ingot 11, extends along a crystal orientation [100].

Although the ingot 11 is fabricated such that the crystal plane (100) is exposed on each of the face side 11a and the reverse side 11b, a plane slightly inclined to the crystal plane (100) may be exposed on each of the face side 11a and the reverse side 11b due to processing errors, etc. that may have occurred in the manufacturing process.

Specifically, a plane that is inclined to the crystal plane (100) by an angle of 1° or less may be exposed on each of the face side 11a and the reverse side 11b. In other words, the crystal axis of the ingot 11 may extend along a direction that is inclined to the crystal orientation by an angle of 1° or less.

The ingot 11 has an orientation flat 13 defined on a side surface 11c thereof. The ingot 11 has a center C positioned on a particular crystal orientation, given herein as a crystal orientation for the sake of convenience, included in crystal orientations <110> as viewed from the orientation flat 13. A crystal plane (011) of monocrystalline silicon is exposed on the orientation flat 13.

Figure 3:
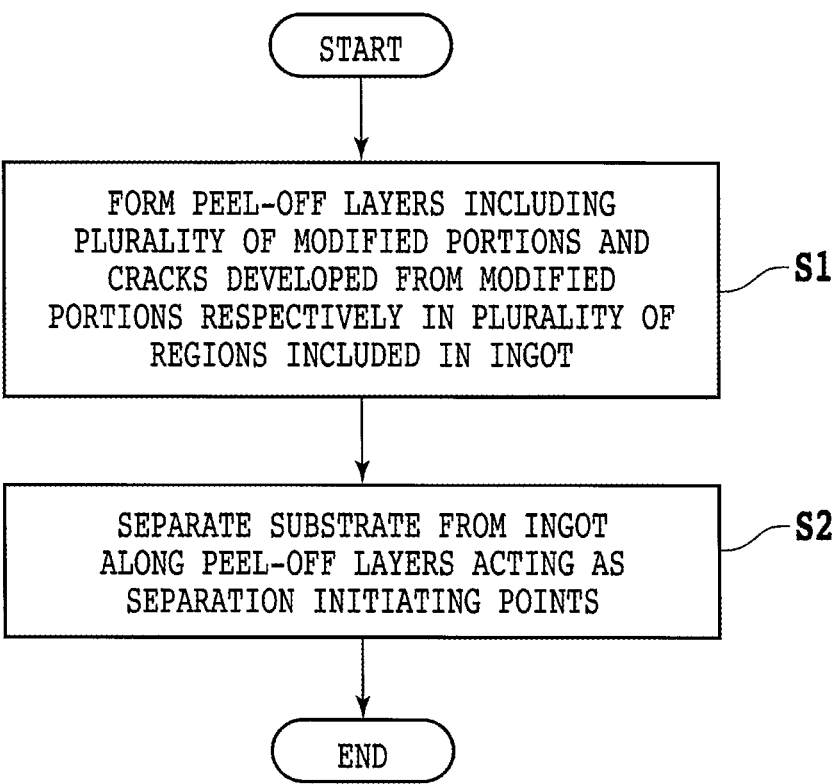
FIG. 3 is a flowchart schematically illustrating, by way of example, a method of manufacturing a monocrystalline silicon substrate from the ingot as a workpiece according to an embodiment of the present invention.

FIG. 3 is a flowchart of a method of manufacturing a monocrystalline silicon substrate from the ingot 11 as a workpiece according to an embodiment of the present invention. According to the method, a plurality of peel-off layers including a plurality of modified portions and cracks developed from the modified portions are formed respectively in a plurality of regions included in the ingot 11 (peel-off layer forming step S1).

Figure 4:
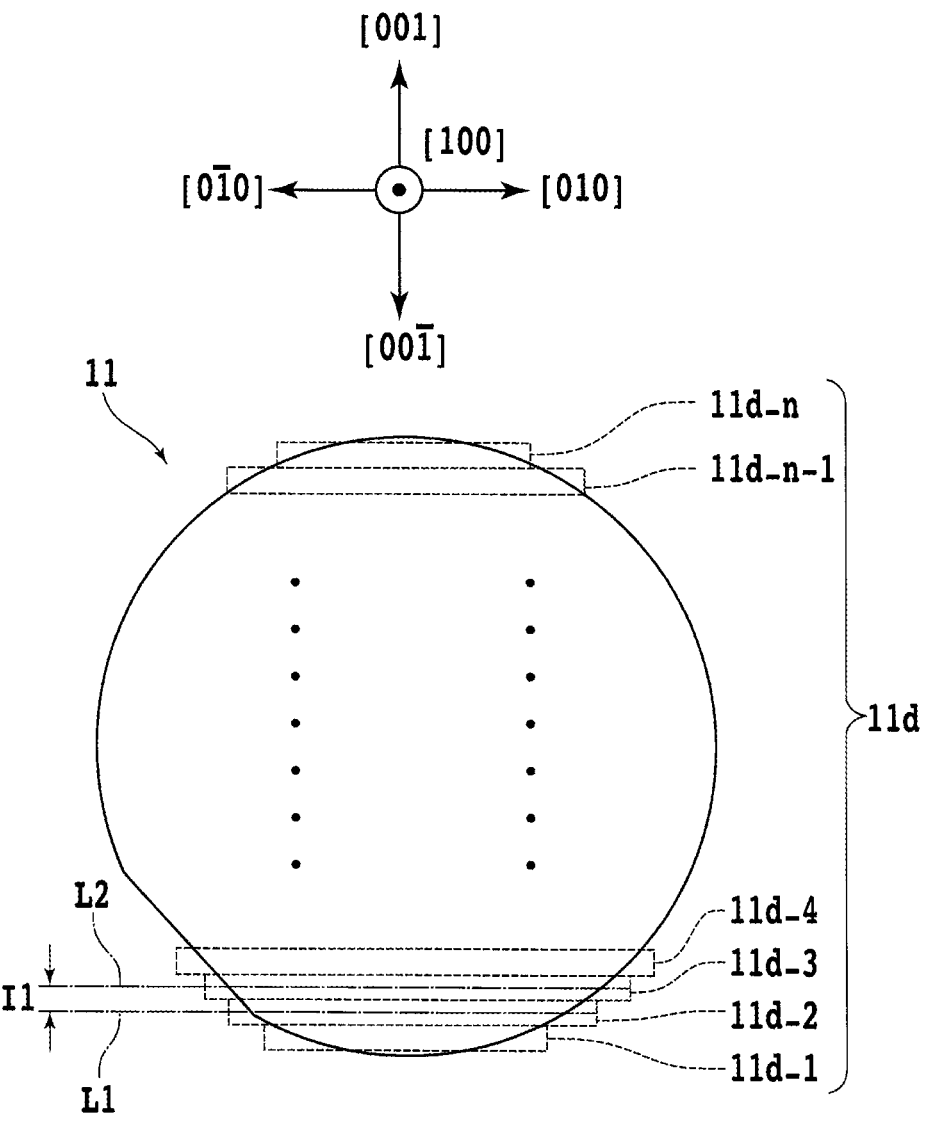
FIG. 4 is a schematic plan view illustrating a plurality of regions included in the ingot.

FIG. 4 schematically illustrates, in plan, the regions in which peel-off layers are to be formed in peel-off layer forming step S1. As illustrated in FIG. 4, each of the regions, denoted by 11d, e.g., n (n represents an even number of 20 or larger, for example) regions 11d_1, 11d_2, 11d_3, and 11d_4 to 11d_n−1 and 11d_n, extends along a crystal orientation [010].

The centers of adjacent ones of the regions 11d are spaced from each other by a distance I1 ranging from 100 μm to 1 mm along a crystal orientation [001]. Specifically, the center-to-center distance I1 represents the distance between a straight line L1 extending through the center of one of a pair of adjacent regions, e.g., the region 11d_2, along the crystal orientation [010], and a straight line L2 extending through the center of the other of the pair of adjacent regions, e.g., the region 11d_3, along the crystal orientation [010].

Figure 5:
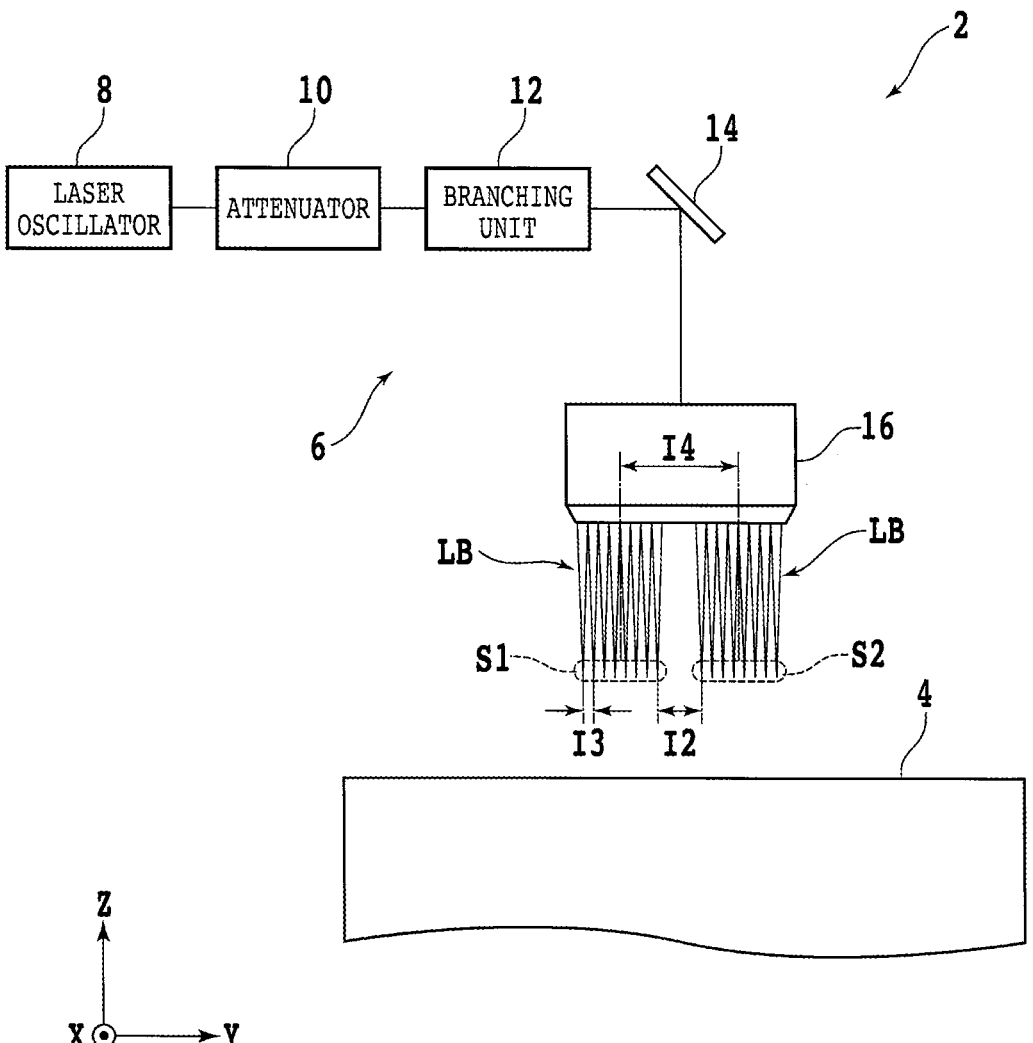
FIG. 5 is a schematic side elevational view, partly in block form, illustrating by an example of a laser processing apparatus that is used to form peel-off layers respectively in the regions included in the ingot.

In the peel-off layer forming step S1, a laser processing apparatus is used to form the peel-off layers including the modified portions and the cracks developed from the modified portions respectively in the regions 11d included in the ingot 11. FIG. 5 schematically illustrates, in side elevation, partly in block form, an example of such a laser processing apparatus, denoted by 2.

In FIG. 5, an X-axis direction, i.e., a first direction, along an X-axis and a Y-axis direction, i.e., a second direction, along a Y-axis extend perpendicularly to each other on a horizontal plane, and a Z-axis direction, i.e., a vertical direction, along a Z-axis extends perpendicularly to the X-axis direction and the Y-axis direction. In FIG. 5, some components of the laser processing apparatus are illustrated in functional block form.

As illustrated in FIG. 5, the laser processing apparatus 2 includes a disk-shaped holding table 4. The holding table 4 has a circular upper surface as a holding surface lying parallel to the X-axis direction and the Y-axis direction for holding the workpiece, i.e., the ingot 11, thereon. The holding table 4 has a disk-shaped porous plate, not illustrated, exposed upwardly at the holding surface.

The porous plate is fluidly connected to a suction source, not illustrated, such as an ejector through a fluid channel or the like, not illustrated, defined in the holding table 4. When the suction source is actuated, it generates and transmits a suction force to a space in the vicinity of the holding surface, thereby enabling the holding table 4 to hold the ingot 11 placed on the holding surface, for example.

The laser processing apparatus 2 further includes a laser beam applying unit 6 disposed above the holding table 4. The laser beam applying unit 6 includes a laser oscillator 8 that has a laser medium of neodymium-doped yttrium aluminum garnet (Nd:YAG) or the like.

The laser oscillator 8 emits a pulsed laser beam LB having a wavelength of 1064 nm or 1342 nm, for example, that is transmittable through the material, i.e., monocrystalline silicon, of the ingot 11 and a frequency of 60 kHz, for example.

After the laser beam LB has had its output power adjusted by an attenuator 10, the laser beam LB is supplied to a branching unit 12. The branching unit 12 has a spatial optical modulator including a liquid crystal phase control element called liquid crystal on silicon (LCoS) and/or a diffractive optical element (DOE), for example.

The branching unit 12 branches the laser beam LB from the attenuator 10 into a plurality of laser beams, also denoted by LB, so as to form a plurality of, e.g., 4 to 40, focused spots arrayed along the Y-axis direction as the laser beams LB are emitted from an emission head 16, to be described later, toward the holding surface of the holding table 4.

Specifically, the branching unit 12 branches the laser beam LB such that the distance I2 between a pair of focused spots positioned at the center of the laser beams emitted from the emission head 16 is comparatively large and the distance I3 between adjacent ones of pairs of the other focused spots is comparatively small.

Stated otherwise, a set S1 of focused spots, e.g., eight focused spots in FIG. 5, each spaced from adjacent ones by the distance I3 and another set S2 of focused spots, e.g., eight focused spots in FIG. 5, each spaced from adjacent ones by the distance I3 are spaced from each other by the distance I2 larger than the distance I3.

The center-to-center distance I4 between the sets S1 and S2 is adjusted to be equal to the center-to-center distance I1 between adjacent ones of the regions 11d included in the ingot 11 illustrated in FIG. 4, for example. The center-to-center distance I4 ranges from 100 µm to 1 mm, for example. The distance I3 ranges from 1 to 20 µm, for example.

The laser beams LB branched by the branching unit 12 are reflected by a mirror 14 and travel to the emission head 16. The emission head 16 houses a condensing lens, not illustrated, for converging the laser beams LB from the mirror 14. The laser beams LB converged by the condensing lens are emitted from an emission area at the center of a lower surface of the emission head 16 downwardly toward the holding surface of the holding table 4.

The emission head 16 of the laser beam applying unit 6 and an optical system including the mirror 14 for directing the laser beams LB to the emission head 16 are coupled to a moving mechanism, not illustrated, including ball screws, electric motors, etc., for example. When the moving mechanism is actuated, the emission area of the emission head 16 for emitting the laser beams LB is moved along the X-axis direction, the Y-axis direction, and/or the Z-axis direction.

Consequently, the laser processing apparatus 2 is able to adjust the positions, i.e., the coordinates, of the focused spots in the X-axis direction, the Y-axis direction, and the Z-axis direction of the respective laser beams LB emitted from the emission head 16 and applied to the holding surface of the holding table 4 by actuating the moving mechanism.

Figure 6:
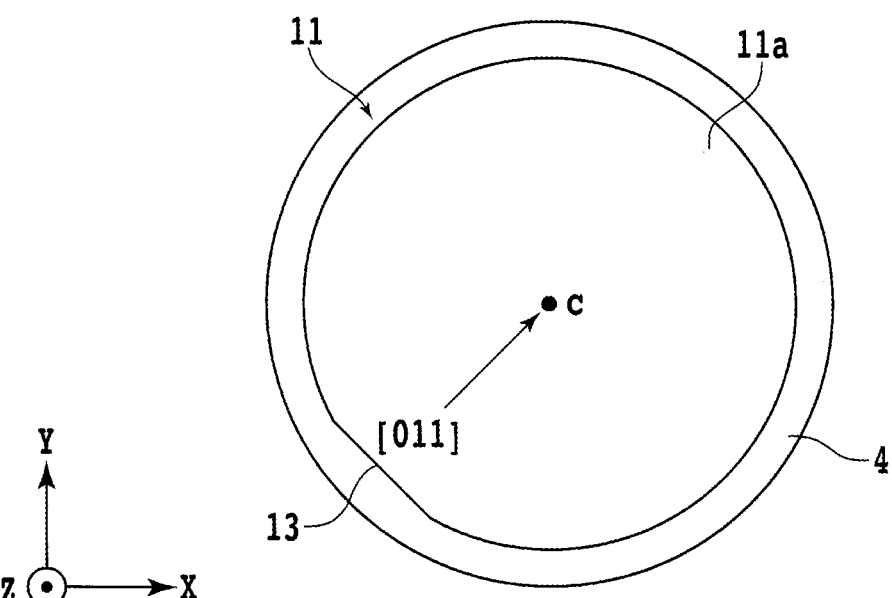
FIG. 6 is a schematic plan view illustrating the manner in which a holding table of the laser processing apparatus holds the ingot thereon.

When the ingot 11 is loaded into the laser processing apparatus 2, the ingot 11 is held on the holding table 4 with the face side 11a facing upwardly. FIG. 6 schematically illustrates, in plan, the manner in which the holding table 4 of the laser processing apparatus 2 holds the ingot 11 thereon.

Specifically, the ingot 11 is held on the holding table 4 such that the direction from the orientation flat 13 toward the center C of the ingot 11, i.e., the crystal orientation [011], is inclined to the X-axis direction and the Y-axis direction by an angle of 45°. For example, the ingot 11 is held on the holding table 4 such that the ingot 11 has its crystal orientation parallel to the X-axis direction and its crystal orientation parallel to the Y-axis direction.

Then, the suction source that is fluidly connected to the porous plate exposed on the holding surface of the holding table 4 is actuated to hold the ingot 11 under suction on the holding table 4. When the ingot 11 has been held on the holding table 4, the peel-off layer forming step S1 is carried out.

Figure 7:
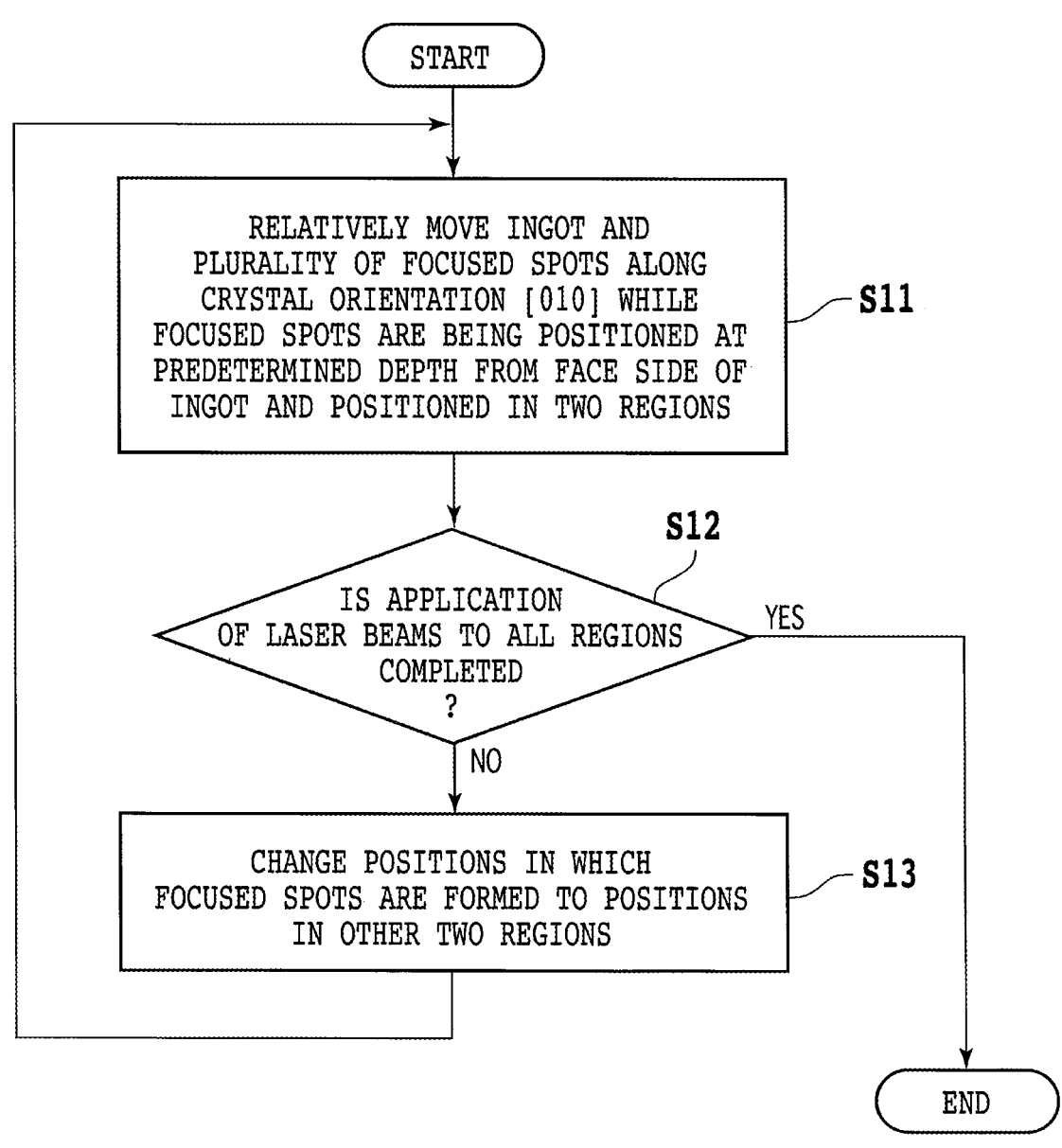
FIG. 7 is a flowchart schematically illustrating, by way of example, a peel-off layer forming step of the method illustrated in FIG. 3.

FIG. 7 is a flowchart schematically illustrating the peel-off layer forming step S1 by way of example. In the peel-off layer forming step S1, while a plurality of focused spots formed by respective laser beams emitted from the emission head 16 are being positioned at a predetermined depth in the ingot 11 from the face side 11a thereof in each of two regions in the ingot 11, the ingot 11 and the focused spots are moved relatively to each other along the X-axis direction, i.e., the crystal orientation (laser beam applying step S11).

Figure 8A:
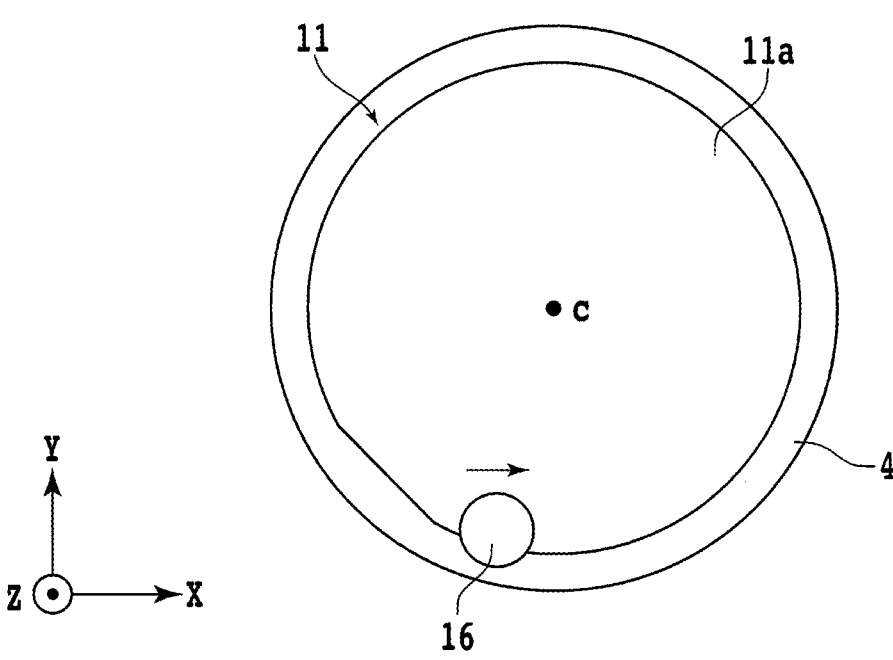
FIG. 8A is a schematic plan view illustrating, by way of example, the manner in which a laser beam applying step is carried out.
Figure 8B:
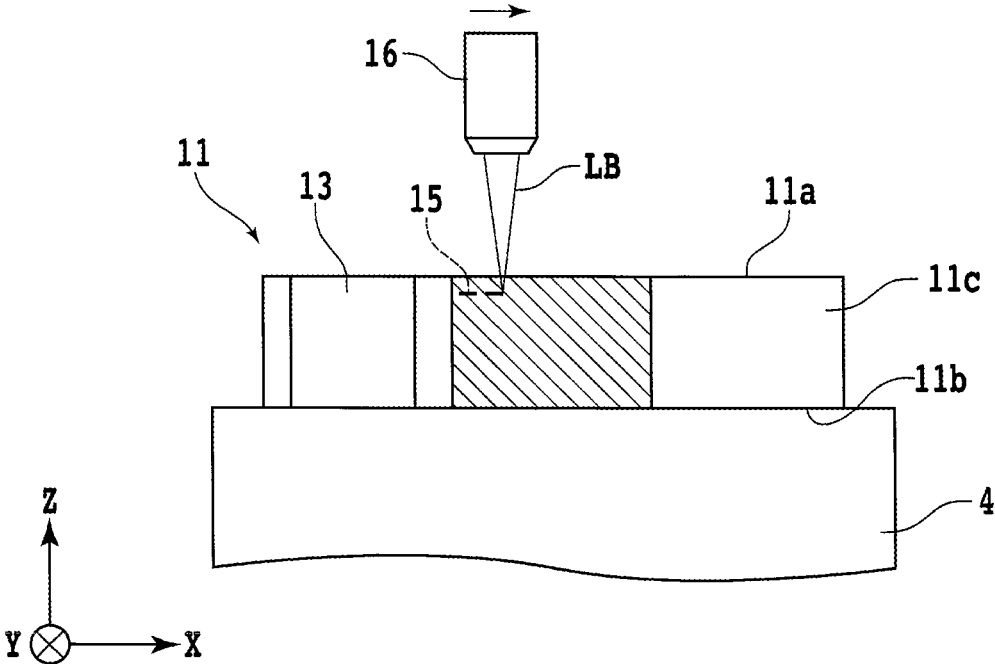
FIG. 8B is a side elevational view, partly in cross section, schematically illustrating, by way of example, the manner in which the laser beam applying step is carried out.
Figure 9:
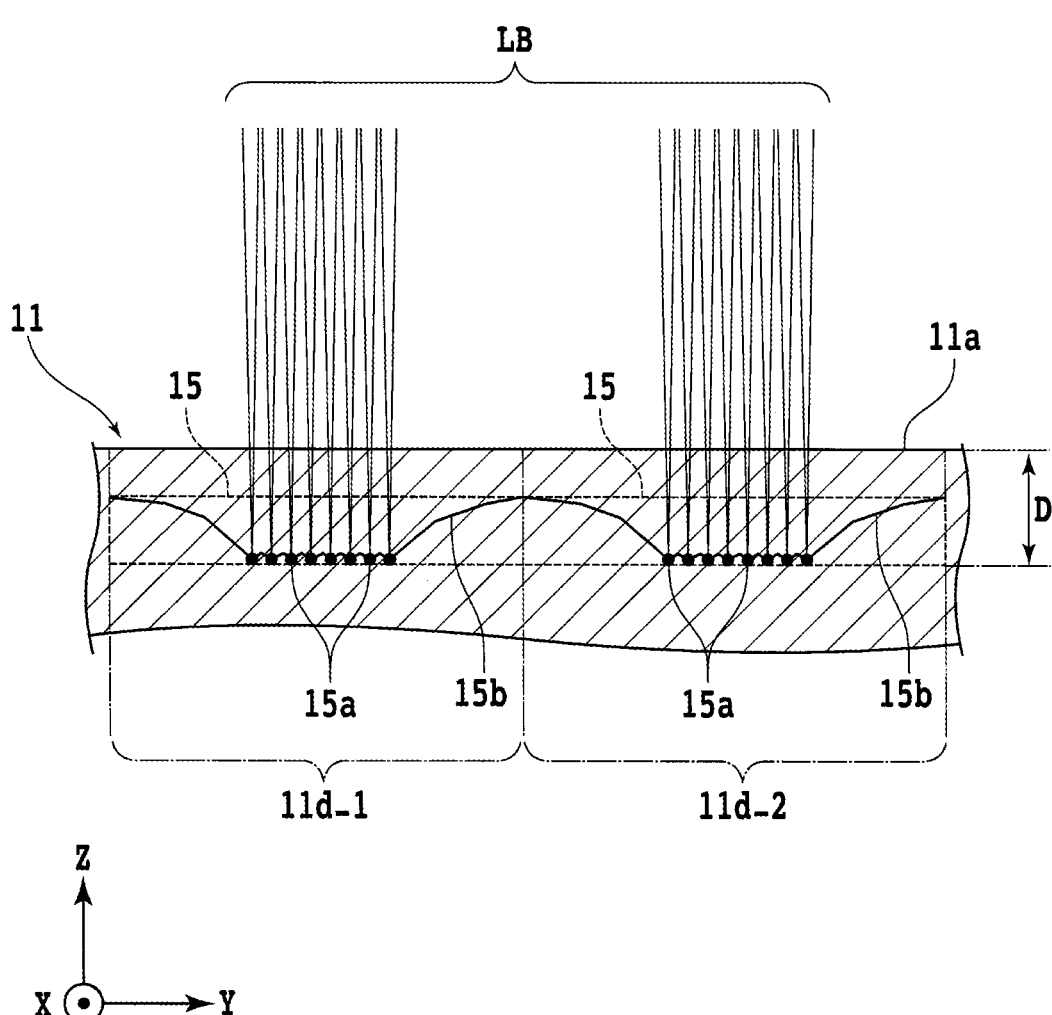
FIG. 9 is a schematic cross-sectional view illustrating peel-off layers formed in the ingot in the laser beam applying step.

FIG. 8A schematically illustrates, by way of example, in plan, the manner in which the laser beam applying step S11 is carried out, and FIG. 8B schematically illustrates, by way of example, in side elevation, partly in cross section, the manner in which the laser beam applying step S11 is carried out. FIG. 9 schematically illustrates, in cross section, peel-off layers formed in the ingot 11 in the laser beam applying step S11.

In the laser beam applying step S11, for example, peel-off layers are initially formed in two regions 11d_1 and 11d_2 positioned at an end in the Y-axis direction, i.e., the crystal orientation [001], among all of the regions 11d.

Specifically, the emission head 16 of the laser beam applying unit 6 is positioned such that the two regions 11d_1 and 11d_2 are positioned in the X-axis direction when viewed from the emission head 16, as viewed in plan. Then, the emission head 16 is lifted or lowered to position the sets S1 and S2 of focused spots illustrated in FIG. 5 at the predetermined depth from the face side 11a of the ingot 11 at the time when the laser beams LB are applied to the ingot 11.

Then, while the laser beams LB are being emitted from the emission head 16 toward the holding table 4, the emission head 16 is moved from one end to the other of the ingot 11 in the X-axis direction, as viewed in plan (see FIGS. 8A and 8B).

The focused spots and the ingot 11 are thus moved relatively to each other along the X-axis direction while the set S1 of focused spots are being positioned in the region 11d_1 and the set S2 of focused spots are being positioned in the region 11d_2.

In each of the two regions 11d_1 and 11d_2, modified portions 15a in which the crystal structure of monocrystal-line silicon is disrupted are formed respectively around the focused spots positioned at the predetermined depth, denoted by D in FIG. 9, from the face side 11a of the ingot 11. When the modified portions 15a are formed in the ingot 11, the volume of the ingot 11 is increased, developing internal stresses in the ingot 11.

The internal stresses are eased when cracks are developed from the modified portions 15a. As a result, peel-off layers 15 including the modified portions 15a and the cracks 15b developed respectively from the modified portions 15a are formed respectively in the two regions 11d_1 and 11d_2.

If the application of the laser beams LB to all of the regions 11d has not yet been completed (step S12: NO), then the positions where the focused spots are to be formed are changed to other at least two regions 11d (indexing feed step S13).

In the indexing feed step S13, the emission head 16 is moved along the Y-axis direction until the emission head 16 is positioned such that the emission head 16 is positioned in the X-axis direction when viewed from the two regions 11d_3 and 11d_4, as viewed in plan. These regions 11d_3 and 11d_4 in which peel-off layers 15 have not yet been formed are positioned adjacent to the two regions 11d_1 and 11d_2 in which the peel-off layers have already been formed.

Then, the laser beam applying step S11 is carried out again, forming peel-off layers 15 similar to the peel-off layers 15 illustrated in FIG. 9 respectively in the two regions 11d_3 and 11d_4 in the ingot 11.

Thereafter, the indexing feed step S13 and the laser beam applying step S11 are alternately repeated until the peel-off layers 15 are formed in all of the regions 11d included in the ingot 11, i.e., until the peel-off layers 15 are formed respec-tively in the two regions 11d_n−1 and 11d_n.

When the peel-off layers 15 have been formed in all of the regions 11d (step S12: YES), the peel-off layer forming step S1 illustrated in FIG. 3 is completed. After the peel-off layer forming step S1 has been carried out, a substrate is separated from the ingot 11 along the peel-off layers 15 that act as separation initiating points in the ingot 11 (separating step S2).

Figure 10A:
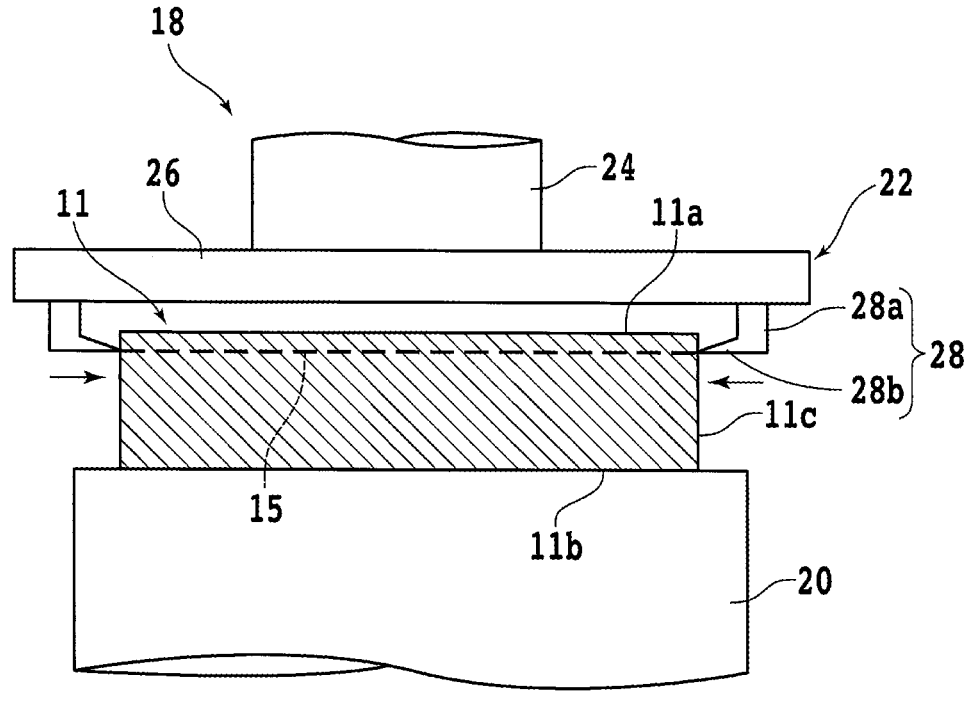
FIG. 10A is a side elevational view, partly in cross section, schematically illustrating, by way of example, the manner in which an example of a separating step of the method illustrated in FIG. 3 is carried out.
Figure 10B:
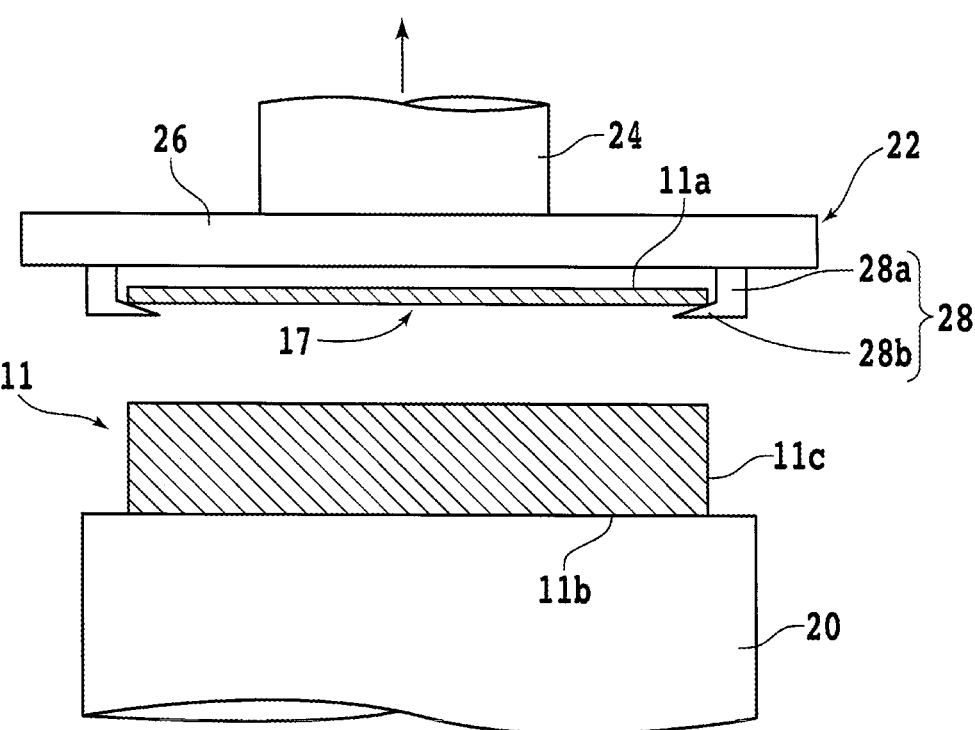
FIG. 10B is a side elevational view, partly in cross section, schematically illustrating, by way of example, the manner in which the example of the separating step of the method illustrated in FIG. 3 is carried out.

FIGS. 10A and 10B schematically illustrate by way of example, in side elevation, partly in cross section, the manner in which an example of the separating step S2 of the method illustrated in FIG. 3 is carried out. The separating step S2 is carried out by a separating apparatus 18 illustrated in FIGS. 10A and 10B.

As illustrated in FIGS. 10A and 10B, the separating apparatus 18 has a holding table 20 for holding thereon the ingot 11 that has the peel-off layers 15 formed therein. The holding table 20 has a circular upper surface as a holding surface with a disk-shaped porous plate, not illustrated, exposed upwardly at the holding surface.

The porous plate is fluidly connected to a suction source, not illustrated, such as an ejector or the like through a fluid channel, not illustrated, defined in the holding table 20. When the suction source is actuated, it generates and trans-mits a suction force to a space in the vicinity of the holding surface, thereby enabling the holding table 20 to hold the ingot 11 placed on the holding surface, for example.

The separating apparatus 18 also includes a separating unit 22 disposed above the holding table 20. The separating unit 22 has a cylindrical support member 24 whose upper portion is coupled to a ball-screw-type lifting and lowering mechanism, not illustrated, and a rotary actuator such as an electric motor.

When the lifting and lowering mechanism is actuated, it lifts or lowers the support member 24. When the rotary actuator is energized, it rotates the support member 24 about an axis passing through the center of the support member 24 in a direction perpendicular to the holding surface of the holding table 20.

The support member 24 has a lower end fixed centrally to an upper portion of a disk-shaped base 26. A plurality of movable members 28 are mounted on a lower surface of an outer circumferential portion of the base 26 and angularly spaced at generally equal intervals circumferentially around the base 26. The movable members 28 have respective plate-shaped vertical portions 28a extending downwardly from the lower surface of the base 26.

The vertical portions 28a have respective upper ends coupled to actuators such as air cylinders, not illustrated, housed in the base 26. When the actuators are actuated, they move the movable members 28 in radial directions of the base 26. The movable members 28 also include respective plate-shaped wedges 28b extending radially inwardly toward the center of the base 26 from respectively inner sides of lower end portion of the vertical portions 28a. The wedges 28b are tapered such that they are progressively thinner toward their pointed distal ends.

When the ingot 11 with the peel-off layers 15 formed therein is loaded into the separating apparatus 18, the ingot 11 whose face side 11a faces upwardly is held on the holding table 20. Specifically, first, the ingot 11 is placed on the holding table 20 such that the center of the reverse side 11b of the ingot 11 and the center of the holding surface of the holding table 20 are aligned with each other.

Then, the suction source that is fluidly connected to the porous plate exposed on the holding surface of the holding table 20 is actuated to hold the ingot 11 under suction on the holding table 20. When the ingot 11 has been held on the holding table 20, the separating step S2 is carried out.

Specifically, the actuators coupled to the movable mem-bers 28 are actuated to position the movable members 28 on a radially outer portion of the base 26. Then, the lifting and lowering mechanism is operated to position the pointed distal ends of the wedges 28b of the respective movable members 28 at a height horizontally aligned with the peel-off layers 15 in the ingot 11.

Then, the actuators are operated to drive the wedges 28b into the side surface 11c of the ingot 11 (see FIG. 10A). Then, the rotary actuator is operated to rotate the wedges 28b driven in the side surface 11c of the ingot 11. Thereafter, the lifting and lowering mechanism is operated to lift the wedges 28b (see FIG. 10B).

When the wedges 28b are thus lifted after being driven into the side surface 11c of the ingot 11 and rotated, the cracks 15b contained in the peel-off layers 15 are further developed. As a result, a portion of the ingot 11 closer to the face side 11a of the ingot 11 and a remaining portion of the ingot 11 closer to the reverse side 11b of the ingot 11 are separated from each other along the peel-off layers 15 that act as separation initiating points. The separated portion of the ingot 11 closer to the face side 11a is now manufactured as a substrate 17 from the ingot 11.

If the portion of the ingot 11 closer to the face side 11a of the ingot 11 and the remaining portion of the ingot 11 closer to the reverse side 11b of the ingot 11 are separated from each other at the time when the wedges 28b are driven into the side surface 11*c* of the ingot 11, then the wedges 28*b* may not be rotated. The actuators and the rotary actuator may be operated simultaneously to drive the rotating wedges 28*b* into the side surface 11*c* of the ingot 11.

According to the method illustrated in FIG. 3, the application of the laser beams LB to the two regions of the regions 11*d* each extending in the ingot 11 along the predetermined direction, i.e., the crystal orientation [010], and the changing from one to another of the regions to which the laser beams are to be applied are alternately repeated to form peel-off layers 15 in the ingot 11 that include a plurality of modified portions 15*a* positioned at the predetermined depth D from the face side 11*a* of the ingot 11 and cracks 15*b* developed from the respective modified portions 15*a*.

According to the method, in other words, the laser beams LB for forming the peel-off layers 15 in the ingot 11 are applied simultaneously to the two regions 11*d*. Consequently, the method makes it possible to increase the throughput compared with a process in which the laser beams LB are applied successively to the regions 11*d*.

According to the method, the laser beams LB are applied along the crystal orientation to the ingot 11 of monocrystalline silicon that has been fabricated such that the crystal plane (100) is exposed on the face side 11*a* and the reverse side 11*b* of the ingot 11. In this case, the peel-off layers 15 formed respectively in the regions 11*d* included in the ingot 11 can be thinned. This advantage will be described in detail below.

Generally, monocrystalline silicon is most likely to cleave along a particular crystal plane included in crystal planes {111}. For example, when the laser beams LB are applied to the ingot 11 in which a crystal plane (100) that is a particular crystal plane included in crystal planes {100} is exposed on the face side 11*a* and the reverse side 11*b* of the ingot 11, along a crystal orientation that is a particular crystal orientation included in crystal orientations <110> of monocrystalline silicon, many cracks 15*b* are developed along crystal planes, i.e., specifically, crystal planes indicated by the expression (1) below, parallel to the crystal orientation [011], among particular crystal planes included in the crystal planes {111}.

[Math. 1]

$$(1\bar{1}1),(11\bar{1}) \tag{1}$$

The angle that the crystal plane (100) forms with the particular crystal plane included in the crystal planes {111} is approximately 54.7°. Therefore, when the laser beams LB are applied to the ingot 11, many cracks 15*b* occur that have larger components along thicknesswise directions of the ingot 11 than components parallel to the face side 11*a* and the reverse side 11*b* of the ingot 11.

On the other hand, the crystal orientation [010] represents a direction that forms a large angle, e.g., 45°, with the particular crystal orientation, e.g., the crystal orientation [011], included in the crystal orientations <110>. Therefore, cracks are not liable to develop along the particular crystal planes, e.g., the crystal planes indicated by the above expression (1), included in the crystal planes {111} from the modified portions 15*a* that are formed in the ingot 11 by the laser beams LB applied thereto.

According to the method illustrated in FIG. 3, moreover, many cracks 15*b* are developed from the modified portions 15*a* formed in the ingot 11 by the laser beams LB applied thereto along crystal planes, i.e., specifically, crystal planes indicated by the expression (2) below, parallel to the crystal orientation [010], among particular crystal planes included in the crystal planes {110}.

[Math. 2]

$$(101),(\bar{1}01) \tag{2}$$

Whereas the angle that the particular crystal plane included in the crystal planes {111} forms with the crystal plane (100) is approximately 54.7°, the angle that a crystal plane, e.g., a crystal plane (101), parallel to the crystal orientation among particular crystal planes included in the crystal planes {111} forms with the crystal plane (100) is 45°.

According to the method, consequently, cracks 15*b* are restrained from occurring, whose components along thicknesswise directions of the ingot 11 are larger than components parallel to the face side 11*a* and the reverse side 11*b* of the ingot 11. In this case, the peel-off layers 15 formed in the ingot 11 are restrained from being thickened.

When the peel-off layers 15 are restrained from being thickened, the amount of monocrystalline silicon of the ingot 11 and the substrate 17 that is to be disposed of in slicing the substrate 17 from the ingot 11 and planarizing the substrate 17 is reduced. According to the method illustrated in FIG. 3, therefore, it is possible to increase the productivity for the substrate 17 at the time when the substrate 17 is manufactured from the ingot 11 using the laser beams LB.

The method of manufacturing a monocrystalline silicon substrate as described above represents an aspect of the present invention, and the present invention is not limited to the above-described method. An ingot used to manufacture a substrate according to the present invention, for example, is not limited to the ingot 11 illustrated in FIGS. 1, 2, etc.

Specifically, according to the present invention, a substrate may be manufactured from an ingot having a notch defined in a side surface thereof. Alternatively, according to the present invention, a substrate may be manufactured from an ingot that is free of an orientation flat and a notch in a side surface thereof.

The structure of a laser processing apparatus that can be used in the peel-off layer forming step S1 according to the present invention is not limited to the structure of the laser processing apparatus 2 described above. The peel-off layer forming step S1, for example, may be carried out using a laser processing apparatus including a moving mechanism for moving the holding table 4 along the X-axis direction, the Y-axis direction, and/or the Z-axis direction.

Alternatively, the peel-off layer forming step S1 may be carried out using a laser processing apparatus that includes a scanning optical system capable of changing the direction of the laser beams LB emitted from the emission head 16 in the laser beam applying unit 6. The scanning optical system includes, for example, a galvanoscanner, an acousto-optical device (AOD), a polygon mirror, and/or the like.

In other words, in the peel-off layer forming step S1 according to the present invention, the ingot 11 held on the holding table 4 and the focused spots of the respective laser beams LB emitted from the emission head 16 may only need to move relatively to each other along the X-axis direction, the Y-axis direction, and the Z-axis direction, and any structures may be used to move the ingot 11 and the focused spots relatively to each other.

Furthermore, the peel-off layer forming step S1 according to the present invention may be carried out using a laser processing apparatus having a laser beam applying unit that includes a beam splitter. The beam splitter is disposed, for example, between a laser oscillator that is similar, in structure, to the laser oscillator 8 illustrated in FIG. 5 and a branching unit including a spatial optical modulator including LCoS and/or DOE.

In the laser beam applying unit, a laser beam emitted from the laser oscillator is branched into two laser beams by the beam splitter. Each of the branched two laser beams is further branched by the branching unit into a plurality of laser beams having respective focused spots where adjacent ones of pairs of the focused spots are positioned at generally equal spaced intervals, and the branched laser beams are introduced into an emission head that is of a similar structure to the emission head 16 illustrated in FIG. 5.

With the above arrangement, the laser beam from the laser oscillator can be branched such that the distance between a pair of focused spots positioned at the center of the laser beams emitted from the emission head is comparatively large and the distance between adjacent ones of pairs of the other focused spots is comparatively small. Therefore, the emission head of the laser beam applying unit can emit laser beams similar to the laser beams LB illustrated in FIG. 5.

Figure 11:
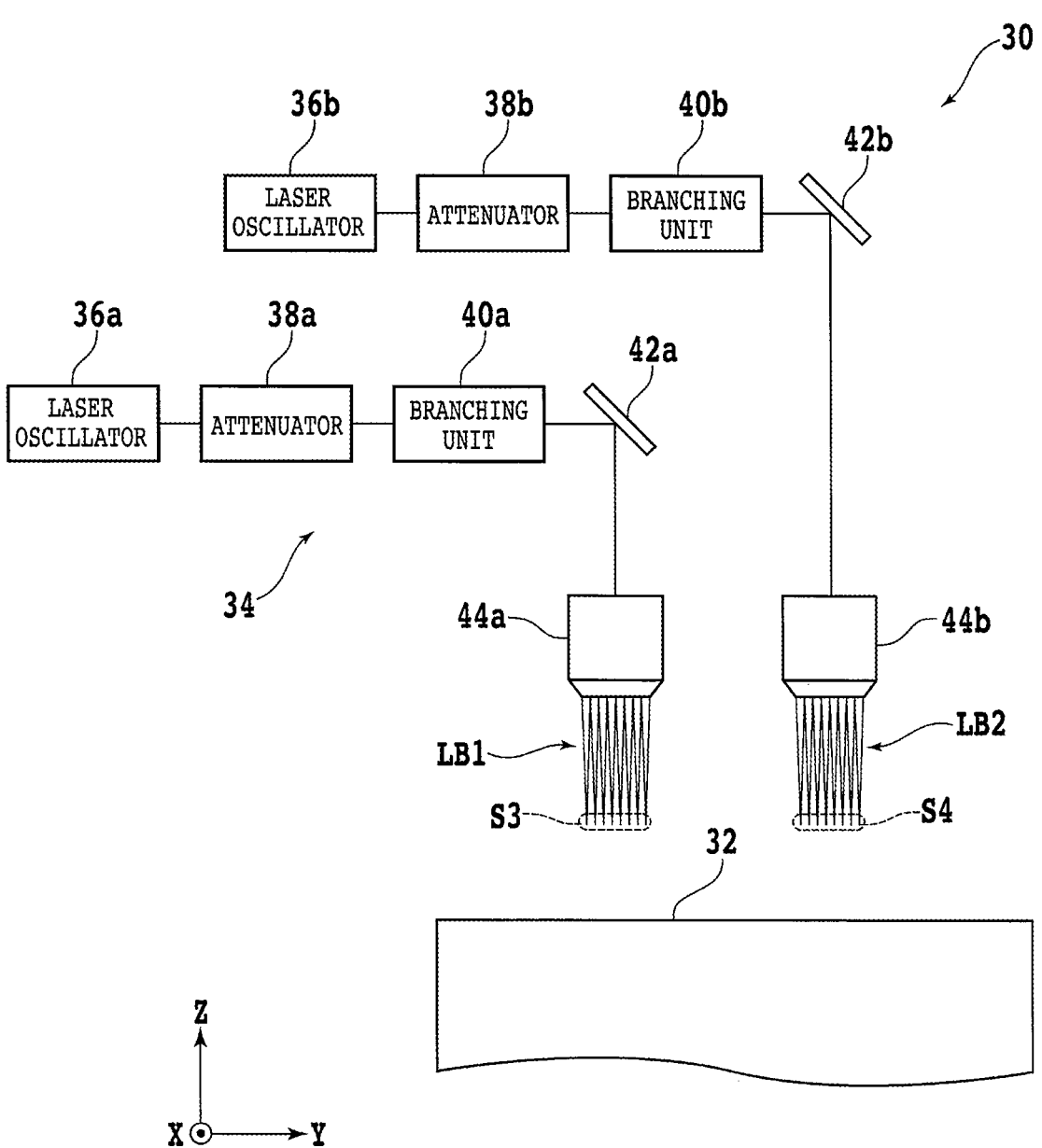
FIG. 11 is a schematic side elevational view, partly in block form, illustrating another example of a laser processing apparatus that is used to form peel-off layers respectively in regions included in an ingot.

Moreover, the peel-off layer forming step S1 according to the present invention may be carried out using a laser processing apparatus having a laser beam applying unit that includes two laser oscillators. FIG. 11 schematically illustrates an example of such a laser processing apparatus.

An X-axis direction along an X-axis, a Y-axis direction along a Y-axis, and a Z-axis direction along a Z-axis illustrated in FIG. 11 correspond respectively to the X-axis direction along the X-axis, the Y-axis direction along the Y-axis, and the Z-axis direction along the Z-axis illustrated in FIG. 5. In FIG. 11, some components of the laser processing apparatus are illustrated in functional block form.

The laser processing apparatus, denoted by 30 in FIG. 11, has a holding table 32 that is similar, in structure, to the holding table 4 illustrated in FIG. 5, for example. The laser processing apparatus also includes a laser beam applying unit 34 disposed above the holding table 32.

The laser beam applying unit 34 has two laser oscillators 36a and 36b. Each of the laser oscillators 36a and 36b is structurally similar to the laser oscillator 8 illustrated in FIG. 5, for example.

A laser beam LB1 emitted from the laser oscillator 36a has its output power adjusted by an attenuator 38a and then is supplied to a branching unit 40a. The branching unit 40a branches the laser beam LB1 from the attenuator 38a into a plurality of laser beams, also denoted by LB1, so as to form a plurality of, e.g., 2 to 20, focused spots arrayed along the Y-axis direction as the laser beams LB1 are emitted from an emission head 44a, to be described later, toward the holding surface of the holding table 32.

Specifically, the branching unit 40a branches the laser beam LB1 into a plurality of laser beams LB1 having respective focused spots, e.g., eight focused spots in FIG. 11, where adjacent ones of pairs of the focused spots are spaced at generally equal intervals. For example, the branching unit 40a branches the laser beam LB1 into a plurality of laser beams LB1 such that their focused spots are spaced at intervals ranging from 1 to 20 μm.

The laser beams LB1 branched by the branching unit 40a are reflected by a mirror 42a and travel to the emission head 44a that is similar, in structure, to the emission head 16 illustrated in FIG. 5, for example. The emission head 44a and an optical system including the mirror 42a for directing the laser beams LB1 to the emission head 44a are coupled to a first moving mechanism, not illustrated.

The first moving mechanism includes ball screws, electric motors, etc., for example. When the first moving mechanism is actuated, the emission area of the emission head 44a for emitting the laser beams LB1 is moved along the X-axis direction, the Y-axis direction, and/or the Z-axis direction.

Consequently, the laser processing apparatus 30 is able to adjust the positions, i.e., the coordinates, of the focused spots in the X-axis direction, the Y-axis direction, and the Z-axis direction of the respective laser beams LB1 emitted from the emission head 44a and applied to the holding surface of the holding table 32 by actuating the first moving mechanism.

Likewise, a laser beam LB2 emitted from the laser oscillator 36b has its output power adjusted by an attenuator 38b and then is supplied to a branching unit 40b. The branching unit 40b branches the laser beam LB2 from the attenuator 38b into a plurality of laser beams, also denoted by LB2, so as to form a plurality of, e.g., 2 to 20, focused spots arrayed along the Y-axis direction as the laser beams LB2 are emitted from an emission head 44b, to be described later, toward the holding surface of the holding table 32.

Specifically, the branching unit 40b branches the laser beam LB2 into a plurality of laser beams LB2 having respective focused spots, e.g., eight focused spots in FIG. 11, where adjacent ones of pairs of the focused spots are spaced at generally equal intervals. For example, the branching unit 40b branches the laser beam LB2 into a plurality of laser beams LB2 such that their focused spots are spaced at intervals ranging from 1 to 20 μm.

The laser beams LB2 branched by the branching unit 40b are reflected by a mirror 42b and travel to the emission head 44b that is similar, in structure, to the emission head 16 illustrated in FIG. 5, for example. The emission head 44b and an optical system including the mirror 42b for directing the laser beams LB2 to the emission head 44b are coupled to a second moving mechanism, not illustrated.

The second moving mechanism includes ball screws, electric motors, etc., for example. When the second moving mechanism is actuated, the emission area of the emission head 44b for emitting the laser beams LB2 is moved along the X-axis direction, the Y-axis direction, and/or the Z-axis direction.

Consequently, the laser processing apparatus 30 is able to adjust the positions, i.e., the coordinates, of the focused spots in the X-axis direction, the Y-axis direction, and the Z-axis direction of the respective laser beams LB2 emitted from the emission head 44b and applied to the holding surface of the holding table 32 by actuating the second moving mechanism.

Therefore, the laser processing apparatus 30 can change the distance in the Y-axis direction between a set S3 of the focused spots of the respective laser beams LB1 and a set S4 of the focused spots of the respective laser beams LB2 to any desired distance, for example.

When the peel-off layer forming step S1 is carried out using the laser processing apparatus 30, peel-off layers 15 can be formed in desired two of the regions 11d included in the ingot 11. For example, peel-off layers 15 may be formed successively in those pairs of the regions 11d included in the ingot 11 that are positioned progressively radially inwardly across the ingot 11.

Specifically, in a first session of the laser beam applying step S11, peel-off layers 15 may be formed respectively in the regions 11d_1 and 11d_n, and in a k-th (k indicates a natural number ranging from 2 to n/2) session of the laser beam applying step S11, peel-off layers 15 may be formed respectively in the regions 11d_k and 11d_n+1-k.

Alternatively, the peel-off layer forming step S1 according to the present invention may be carried out using a laser processing apparatus that is capable of forming three or more sets of focused spots of respective laser beams.

The laser processing apparatus includes a laser beam applying unit having a branching unit for forming three or more sets of focused spots, for example. Specifically, the branching unit branches a laser beam into a plurality of laser beams so as to form at least three sets of their focused spots spaced at a predetermined interval such that adjacent two of the at least three sets are spaced apart at an interval larger than the predetermined interval.

Alternatively, the laser processing apparatus may include a laser beam applying unit having at least three laser oscillators each similar, in structure, to the laser oscillator 8 illustrated in FIG. 5. Each of the laser oscillators has a similar structure to the laser oscillator 8 illustrated in FIG. 5, for example.

A laser beam emitted from each of the laser oscillators travels through a branching unit having a similar structure to the branching units 40*a* and 40*b* illustrated in FIG. 11, for example, and is introduced into an emission head having a similar structure to the emission head 16 illustrated in FIG. 5, for example.

In other words, the laser processing apparatus includes at least three branching units and at least three emission heads, and a laser beam emitted from each of the at least three laser oscillators travels through either one of the at least three branching units and is introduced into either one of the at least three emission heads.

Moreover, the at least three emission heads and optical systems for introducing laser beams into the emission heads are coupled to respective moving mechanisms that are independent of each other. When the moving mechanisms are actuated, the emission areas of the emission heads for emitting the laser beams are moved along the X-axis direction, the Y-axis direction, and/or the Z-axis direction.

Consequently, the laser processing apparatus is able to adjust the positions, i.e., the coordinates, of the focused spots in the X-axis direction, the Y-axis direction, and the Z-axis direction of the respective laser beams emitted from the emission heads and applied to the holding surface of the holding table by actuating the moving mechanisms.

Therefore, the laser processing apparatus can change, as desired, the distance between a pair of adjacent sets among the three sets of the focused spots of the respective laser beams, for example.

When the peel-off layer forming step S1 is carried using the above laser processing apparatus, peel-off layers 15 may be formed simultaneously in at least three regions among the regions 11*d*.

Furthermore, the regions included in the ingot 11 to which the laser beams LB are applied in the peel-off layer forming step S1 according to the present invention are not limited to the regions along the crystal orientation [010]. According to the present invention, for example, the laser beams LB may be applied to a plurality of regions each along the crystal orientation [001].

When the laser beams LB are applied to the ingot 11, cracks are likely to be developed in crystal planes indicated by the expression (3) below.

[Math. 3]

$$(110),(\bar{1}10) \tag{3}$$

According to the present invention, moreover, the laser beams LB may be applied to regions extending along a direction slightly inclined to the crystal orientation or the crystal orientation [001], as viewed in plan. This alternative will be described hereinbelow with reference to FIG. 12.

Figure 12:
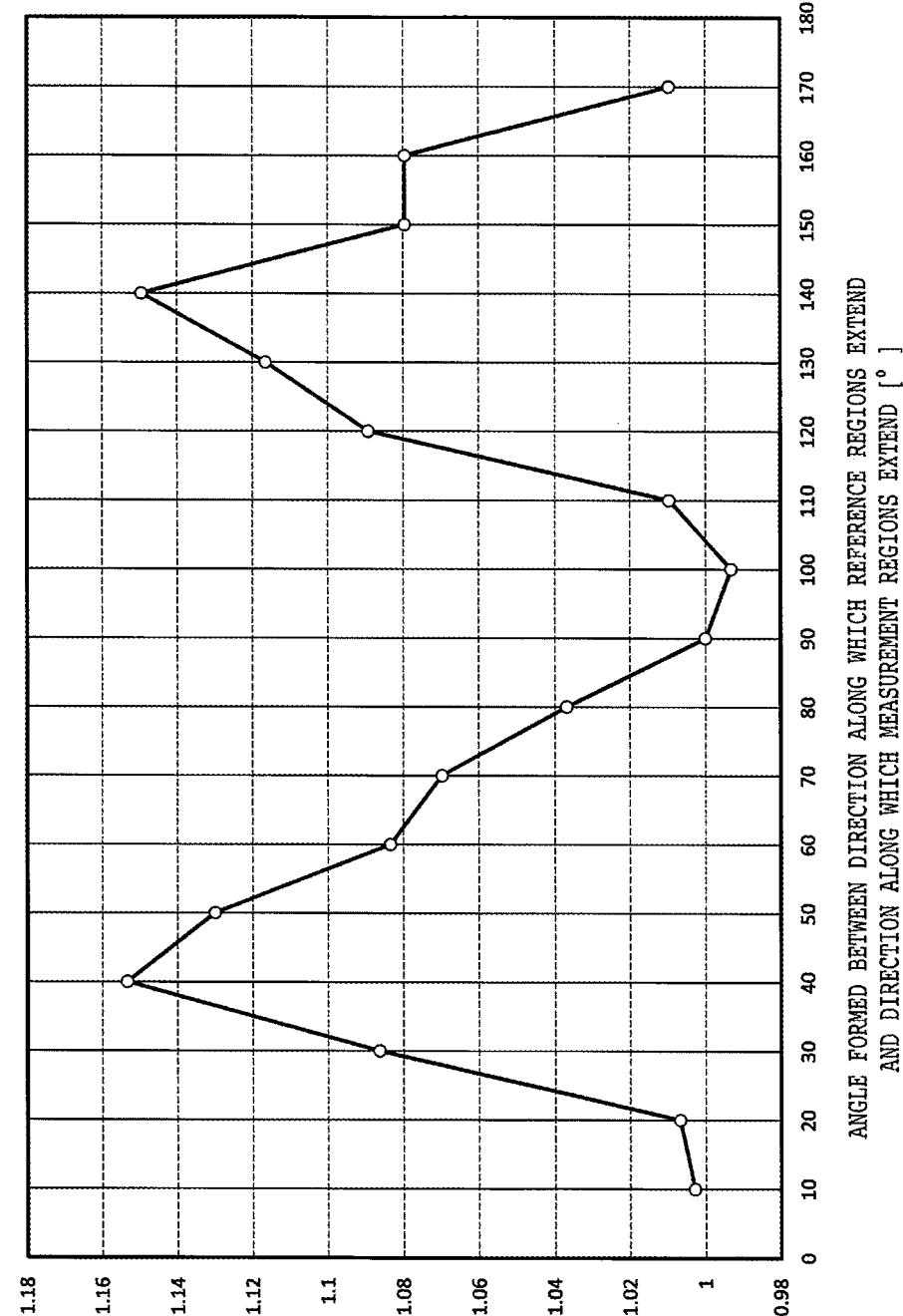
FIG. 12 is a graph illustrating the widths of peel-off layers that are formed in a workpiece of monocrystalline silicon when laser beams are applied to regions of the workpiece along respective different crystal orientations thereof.

FIG. 12 is a graph illustrating the widths of peel-off layers that are formed in a workpiece of monocrystalline silicon when laser beams LB are applied to regions of the workpiece along respective different crystal orientations thereof. The horizontal axis of the graph represents, as viewed in plan, the angles formed between a direction along which a region, i.e., reference region, perpendicular to the crystal orientation extends and a direction along which regions, i.e., measurement regions, to be measured extend.

At the angle of 45° on the horizontal axis of the graph, the region along the crystal orientation [001] is to be measured. Similarly, at the angle of 135° on the horizontal axis of the graph, the region along the crystal orientation is to be measured.

The vertical axis of the graph represents values obtained by dividing the widths of peel-off layers formed in the measurement regions by applying the laser beams LB to the measurement regions by the width of peel-off layer formed in the reference region by applying the laser beams LB to the reference region.

As illustrated in FIG. 12, the widths of the peel-off layers become larger when the angle formed between the direction along which the reference region extends and the direction along which the measurement regions extend is in the range from 40° to 50° or from 130° to 140°. In other words, the widths of the peel-off layers become larger when the laser beams LB are applied to not only the region along the crystal orientation [001] or the crystal orientation [010], but also the region along a direction that forms an angle of 5° or less with those crystal orientations.

Therefore, in the peel-off layer forming step S1 according to the present invention, the laser beams LB may be applied to a plurality of regions extending along a direction inclined to the crystal orientation [001] or the crystal orientation [010] by 5° or less, as viewed in plan.

Specifically, in the peel-off layer forming step S1 according to the present invention, the laser beams LB may be applied to a plurality of regions extending along a direction parallel to a crystal plane, herein the crystal plane (100), exposed on the face side 11*a* and the reverse side 11*b* of the ingot 11, among particular crystal planes included in the crystal planes {100}, and forming an angle of 5° or less with a particular crystal orientation, herein the crystal orientation [001] or the crystal orientation [010], included in the crystal orientations <100>.

According to the present invention, furthermore, it is not an essential feature to form peel-off layers 15 in the ingot 11 in its entirety in the peel-off layer forming step S1. If cracks 15*b* and 15*d* are developed in a region near the side surface 11*c* of the ingot 11 in the separating step S2, for example, then peel-off layers 15 may not be formed partly or entirely in a region near the side surface 11*c* of the ingot 11 in the peel-off layer forming step S1.

According to the present invention, moreover, the separating step S2 may be carried out using an apparatus other than the separating apparatus 18 illustrated in FIGS. 10A and 10B. In the separating step S2 according to the present invention, for example, the substrate 17 may be separated from the ingot 11 by pulling the face side 11*a* of the ingot 11 under suction.

Figure 13A:
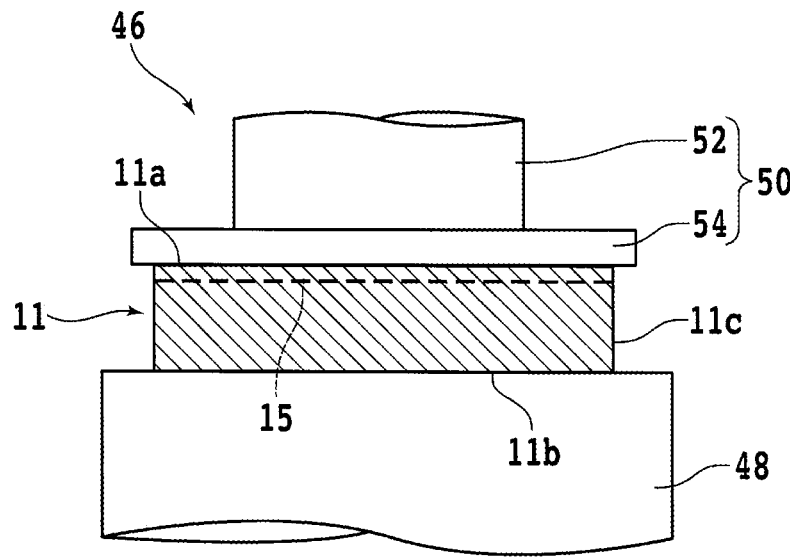
FIG. 13A is a side elevational view, partly in cross section, schematically illustrating, by way of example, the manner in which another example of a separating step of the method illustrated in FIG. 3 is carried out.
Figure 13B:
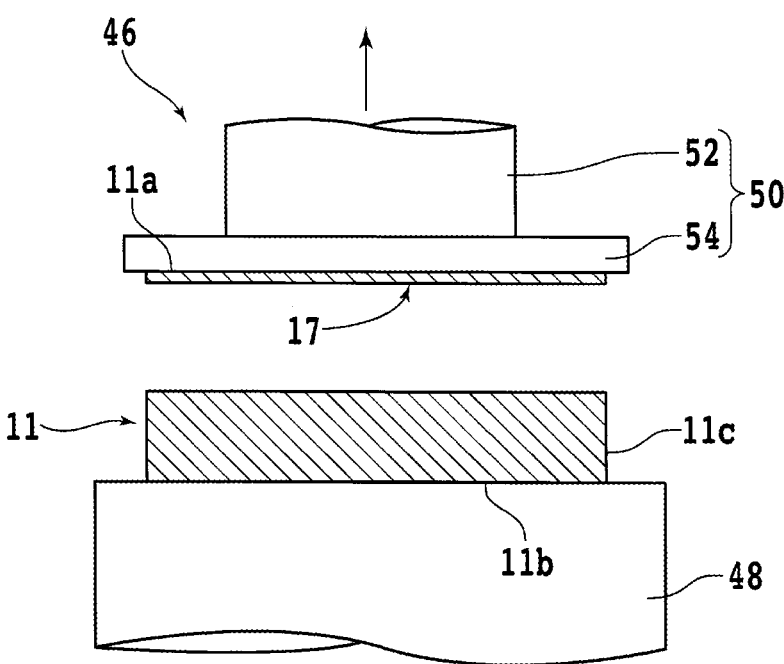
FIG. 13B is a side elevational view, partly in cross section, schematically illustrating, by way of example, the manner in which the other example of the separating step of the method illustrated in FIG. 3 is carried out.

Each of FIGS. 13A and 13B schematically illustrates, in side elevation, partly in cross section, the manner in which the separating step S2 is carried out as described above. A separating apparatus 46 illustrated in FIGS. 13A and 13B has a holding table 48 for holding thereon the ingot 11 with the peel-off layers 15 formed therein.

The holding table 48 has a circular upper surface as a holding surface with a porous plate, not illustrated, exposed upwardly at the holding surface. The porous plate is fluidly connected to a suction source, not illustrated, such as an ejector through a fluid channel or the like, not illustrated, defined in the holding table 48.

When the suction source is actuated, it generates and transmits a suction force to a space in the vicinity of the holding surface of the holding table 48, thereby enabling the holding table 48 to hold the ingot 11 placed on the holding surface, for example.

The separating apparatus 46 also includes a separating unit 50 disposed above the holding table 48. The separating unit 50 has a cylindrical support member 52 whose upper portion is coupled to a ball-screw-type lifting and lowering mechanism, not illustrated, for example. When the lifting and lowering mechanism is actuated, it lifts or lowers the support member 52.

The support member 52 has a lower end fixed centrally to an upper portion of a disk-shaped suction plate 54. The suction plate 54 has a plurality of suction ports defined in a lower surface thereof and held in fluid communication with a suction source, not illustrated, such as an ejector through a fluid channel or the like, not illustrated, defined in the suction plate 54.

When the suction source is actuated, it generates and transmits a suction force to a space in the vicinity of the lower surface of the suction plate 54, thereby enabling the suction plate 54 to pull upwardly, under suction, the ingot 11 positioned near the lower surface of the suction plate 54.

When the ingot 11 with the peel-off layers formed therein is loaded into the separating apparatus 46, the ingot 11 whose face side 11a faces upwardly is held on the holding table 48. Specifically, first, the ingot 11 is placed on the holding table 48 such that the center of the reverse side 11b of the ingot 11 and the center of the holding surface of the holding table 48 are aligned with each other.

Then, the suction source that is fluidly connected to the porous plate exposed on the holding surface of the holding table 48 is actuated to hold the ingot 11 under suction on the holding table 48. When the ingot 11 has been held on the holding table 48, the separating step S2 is carried out.

Specifically, the lifting and lowering mechanism is operated to lower the support member 52 and the suction plate 54 until the lower surface of the suction plate 54 is brought into contact with the face side 11a of the ingot 11. Then, the suction source fluidly connected to the suction ports defined in the suction plate 54 is actuated to transmit a suction force into the suction ports, attracting the face side 11a of the ingot 11 under suction to the lower surface of the suction plate 54 (see FIG. 13A).

Then, the lifting and lowering mechanism is operated to lift the support member 52 and the suction plate 54 to space the suction plate 54 upwardly away from the holding table 48 (see FIG. 13B). At this time, an upward force acts on the face side 11a of the ingot 11 that is attracted to the lower surface of the suction plate 54 by the suction force applied through the suction ports.

As a consequence, the cracks 15b included in the peel-off layers 15 are further developed, allowing a portion of the ingot 11 near the face side 11a thereof to be separated from the remainder of the ingot 11 near the reverse side 11b thereof. In other words, a substrate 17 is manufactured from the ingot 11 along the peel-off layers 15 acting as separation initiating points.

Furthermore, according to the present invention, in the separating step S2, ultrasonic waves may be applied to the face side 11a of the ingot 11 before the portion of the ingot 11 near the face side 11a thereof is separated from the remainder of the ingot 11 near the reverse side 11b thereof. Since the ultrasonic waves thus applied make the cracks 15b included in the peel-off layers 15 yet further developed, the portion of the ingot 11 near the face side 11a thereof can easily be separated from the remainder of the ingot 11 near the reverse side 11b thereof.

Moreover, according to the present invention, the face side 11a of the ingot 11 may be ground or polished to a flat finish in a planarizing step prior to the peel-off layer forming step S1. The planarizing step may be carried out when a plurality of substrates are manufactured from the ingot 11, for example.

Specifically, when the substrate 17 is separated from the ingot 11 along the peel-off layers 15, the newly exposed surface of the ingot 11 includes surface irregularities that reflect the distribution of the modified portions 15a and the cracks 15b included in the peel-off layers 15. For manufacturing a new substrate from the ingot 11, therefore, it is preferable to planarize the newly exposed surface of the ingot 11 prior to the peel-off layer forming step S1.

The planarized surface of the ingot 11 is effective to prevent the laser beams LB applied to the ingot 11 in the peel-off layer forming step S1 from being irregularly reflected. According to the present invention, the surface of the substrate 17 separated from the ingot 11 along the peel-off layers 15 may similarly be planarized by grinding or polishing as the surface of the substrate 17 also includes surface irregularities.

According to the present invention, furthermore, a substrate may be manufactured from a bare wafer as a workpiece that is made of monocrystalline silicon that has been fabricated such that a particular crystal plane included in crystal planes {100} is exposed on face and reverse sides thereof.

The bare wafer is twice to five times thicker than the substrate to be manufactured therefrom, for example. The bare wafer is manufactured by being separated from the ingot 11 according to the same process as the method described above. It can thus be phrased that the substrate is manufactured from the ingot 11 by repeating the above method twice.

According to the present invention, moreover, a substrate may be manufactured from a cylindrical device wafer as a workpiece that is fabricated from the above bare wafer with semiconductor devices formed thereon. In this case, it is preferable to apply the laser beams LB to the device wafer from a side on which the semiconductor devices are not formed, to prevent adverse effects to the semiconductor devices.

The structure, method, etc. according to the above embodiment may be changed or modified appropriately without departing from the scope of the present invention.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A method of manufacturing a monocrystalline silicon substrate from a workpiece of monocrystalline silicon that has been fabricated such that a particular crystal plane included in crystal planes {100} is exposed on face and reverse sides thereof, comprising:

a peel-off layer forming step of forming peel-off layers including a plurality of modified portions and cracks developed respectively from the modified portions, respectively in a plurality of regions included in the workpiece; and, after the peel-off layer forming step, a separating step of separating the substrate from the workpiece along the peel-off layers acting as separation initiating points, wherein:

each of the regions extends along a first direction, the first direction represents a direction oriented parallel to the particular crystal plane and forming an angle of 5° or less with a particular crystal orientation included in crystal orientations <100>, adjacent ones of the regions are spaced from each other by a predetermined center-to-center distance in a second direction, the second direction represents a direction oriented parallel to the particular crystal plane and perpendicularly to the first direction, the predetermined center-to-center distance ranges from 100 μm to 1 mm, and the peel-off layer forming step is performed by alternately repeating:

a laser beam applying step of relatively moving, along the first direction, the workpiece and a plurality of focused spots formed from respective laser beams having a wavelength transmittable through monocrystalline silicon and arrayed along the second direction, while the plurality of focused spots are being positioned in at least two of the regions at a predetermined depth in the workpiece from the face side thereof, to thereby define a first set of regions, and an indexing feed step of changing positions in which the plurality of focused spots are formed from respective positions in the at least two of the regions to positions in at least other two of the regions that are different from the at least two of the regions, to thereby define a second set of regions, wherein the first set of regions are adjacent to the second set of regions.

2. The method of manufacturing the monocrystalline silicon substrate according to claim 1, wherein a distance between adjacent ones of pairs of the focused spots formed in each of the at least two of the regions is smaller than the predetermined center-to-center distance.

3. The method of manufacturing the monocrystalline silicon substrate according to claim 1, wherein, in the laser beam applying step, cracks formed in one of adjacent ones of the first set of regions and cracks formed in the other of adjacent ones of the first set of regions are connected to each other.

* * * * *